(12) United States Patent
Tu et al.

(10) Patent No.: US 12,087,548 B2
(45) Date of Patent: Sep. 10, 2024

(54) PLASMA REACTOR

(71) Applicant: ADVANCED MICRO-FABRICATION EQUIPMENT INC. CHINA, Shanghai (CN)

(72) Inventors: Leyi Tu, Shanghai (CN); Rubin Ye, Shanghai (CN); Kuan Yang, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 249 days.

(21) Appl. No.: 17/554,269

(22) Filed: Dec. 17, 2021

(65) Prior Publication Data

US 2022/0208521 A1  Jun. 30, 2022

(30) Foreign Application Priority Data

Dec. 25, 2020 (CN) .......................... 202011558590.1

(51) Int. Cl.
*H01J 37/32* (2006.01)
*H01L 21/3065* (2006.01)

(52) U.S. Cl.
CPC .. *H01J 37/32183* (2013.01); *H01J 37/32091* (2013.01); *H01J 37/32642* (2013.01); *H01L 21/3065* (2013.01)

(58) Field of Classification Search
CPC .......... H01J 37/32091; H01J 37/32183; H01J 37/32642; H01L 21/3065
See application file for complete search history.

(56) References Cited

U.S. PATENT DOCUMENTS

| | | | |
|---|---|---|---|
| 2007/0169891 A1* | 7/2007 | Koshiishi .......... | H01L 21/68735 156/345.47 |
| 2009/0236043 A1* | 9/2009 | Matsudo ........... | H01J 37/32577 156/345.43 |
| 2010/0012029 A1* | 1/2010 | Forster .............. | H01J 37/32165 118/708 |
| 2013/0264014 A1* | 10/2013 | Iizuka ..................... | H05H 1/46 156/345.48 |
| 2015/0243486 A1* | 8/2015 | Yokogawa ........ | H01J 37/32697 156/345.28 |

* cited by examiner

*Primary Examiner* — Yuechuan Yu
(74) *Attorney, Agent, or Firm* — WOMBLE BOND DICKINSON US, LLP; Joseph Bach, Esq.

(57) ABSTRACT

A plasma reactor includes: a process chamber, at the inner bottom of the process chamber being provided a base, the base being connected to a RF power source via a RF match network, wherein a to-be-processed wafer is held above the base, an upper electrode assembly is provided at the inner top of the process chamber, and a plasma processing space is arranged between the base and the upper electrode assembly; a first conductive ground ring surrounding the outer periphery of the base; a second conductive ground ring connected between the outer sidewall of the first conductive ground ring and the inner sidewall of the process chamber, a plurality of gas channels being provided on the second conductive ground ring such that gas in the plasma processing space can be exhausted through the plurality of gas channels; an insulating ring provided between the base and the first conductive ground ring, wherein dielectric constant of the insulating ring is less than 3.5.

14 Claims, 6 Drawing Sheets

PLASMA REACTOR

RELATED APPLICATIONS

The present application claims priority to and the benefit of Chinese Patent Application No. 202011558590.1, filed on Dec. 25, 2020, the disclosure of which is hereby incorporated by reference in its entirety.

FIELD

Embodiments of the present disclosure relate to semiconductor processing, and more particularly relate to a capacitively coupled plasma reactor.

BACKGROUND

Semiconductor chips have been widely applied in various types of electronic devices. Plasma etching is a key process to form a designed wafer pattern in manufacturing a semiconductor device. In typical plasma processing, process gases (e.g., $CF_4$, $O_2$, etc.) are excited by radio frequency (RF) in a process chamber to form plasma, wherein the plasma applies physical bombardment to and undergoes a chemical reaction with the wafer surface to thereby etch out chips of a particular structure on the wafer.

A capacitively coupled plasma (CCP) processor is widely applied to the process of etching a dielectric material layer in a chip fabrication process. With constant evolution of plasma etching techniques, critical dimension in semiconductor device manufacturing becomes increasingly smaller. Now, the technology frontier has advanced to a critical dimension of less than 7 nm, even less than 5 nm. Under so small a critical dimension, the steps involved in plasma processing increase significantly, where chip fabrication may involve over 1000 steps; there also poses a very stringent requirement on the uniformity of plasma processing, which is generally required to be less than 2%, or even 1%.

Conventional adjusting methods cannot satisfy such harsh criteria. Therefore, a novel capacitively coupled plasma processor is desired in the industry so as to render a more uniform distribution of plasma density in the global wafer surface.

SUMMARY

Embodiments of the present disclosure provide a plasma reactor, which may mitigate a serious impact on plasma processing uniformity caused by a large amount of high-frequency harmonic in the plasma reactor. The plasma reactor comprises: a process chamber, at the inner bottom of the process chamber being provided a base, the base being connected to a RF power source via a RF match network, wherein a to-be-processed wafer is held above the base, an upper electrode assembly is provided at the inner top of the process chamber, and a plasma processing space is provided between the base and the upper electrode assembly; a first conductive ground ring surrounding the outer periphery of the base; a second conductive ground ring electrically connected between the outer sidewall of the first conductive ground ring and the inner sidewall of the process chamber, a plurality of gas channels being provided on the second conductive ground ring such that gas in the plasma processing space can be exhausted through the plurality of gas channels; an insulating ring with a dielectric constant being less than 3.5 provided between the base and the first conductive ground ring; a couple ring provided above the insulating ring, the couple ring covering the upper surface of the insulating ring and the upper surface of base edge portion, wherein the couple ring is made of a first ceramic material which has a thermal conductivity higher than that of the insulating ring. Such arrangements enable a large amount of harmonic RF power to flow into the RF match network below, which not only avoids disturbance on the distribution of plasma processing, but also prevents over expansion of the insulating ring in the course of plasma processing due to selection of a low dielectric constant polymer insulating ring, thereby ensuring long-term stability of the plasma etching process.

The present disclosure further provides another embodiment, wherein a plasma reactor comprises: a process chamber, at the inner bottom of the process chamber being provided a base, the base being connected to a RF power source via a RF match network, wherein a to-be-processed wafer is held above the base, an upper electrode assembly is provided at the inner top of the process chamber, and a plasma processing space is arranged between the base and the upper electrode assembly; a first conductive ground ring surrounding the outer periphery of the base; a second conductive ground ring electrically connected between the outer sidewall of the first conductive ground ring and the inner sidewall of the process chamber, a plurality of gas channels being provided on the second conductive ground ring such that gas in the plasma processing space can be exhausted through the plurality of gas channels; and an insulating ring provided between the base and the first conductive ground ring; wherein the RF match network supplies, via at least one RF cable, a high frequency RF power of a fundamental frequency to the base, the fundamental frequency being greater than or equal to 40 MHz; plasma in the plasma processing space generates a harmonic RF power derived from the fundamental frequency, the harmonic RF power flowing into the RF match network via the at least one RF cable, wherein the harmonic RF power flowing into the RF match network is greater than 5% of the high frequency RF power. Furthermore, the RF match network includes a first filter configured for the high frequency RF power to pass through, and further includes a second filter configured to allow the harmonic RF power to pass through but block the high frequency RF power; meanwhile, the dielectric constant of the insulating ring is required to be less than 3.5. The present disclosure enables the insulating ring to block the harmonic RF power which can only flow downward into the second filter that has a low impedance to the harmonic RF power, such that the harmonic RF power seriously affecting the plasma processing performance is dissipated in the RF match network.

DETAILED DESCRIPTION

Hereinafter, the technical solution of the present disclosure will be described in a clear and complete manner with reference to the preferred embodiments in conjunction with the accompanying drawings. It is apparent that the embodiments described herein are only part of the embodiments of the present disclosure, not all of them. All other embodiments obtained by those skilled in the art without exercise of inventive work based on the examples in the embodiments all fall within the protection scope of the present disclosure.

To make the above objectives, features, and advantages of the present disclosure clearer and more comprehensible, the present disclosure will be described in further detail through preferred embodiments with reference to the accompanying drawings.

Figure 1:
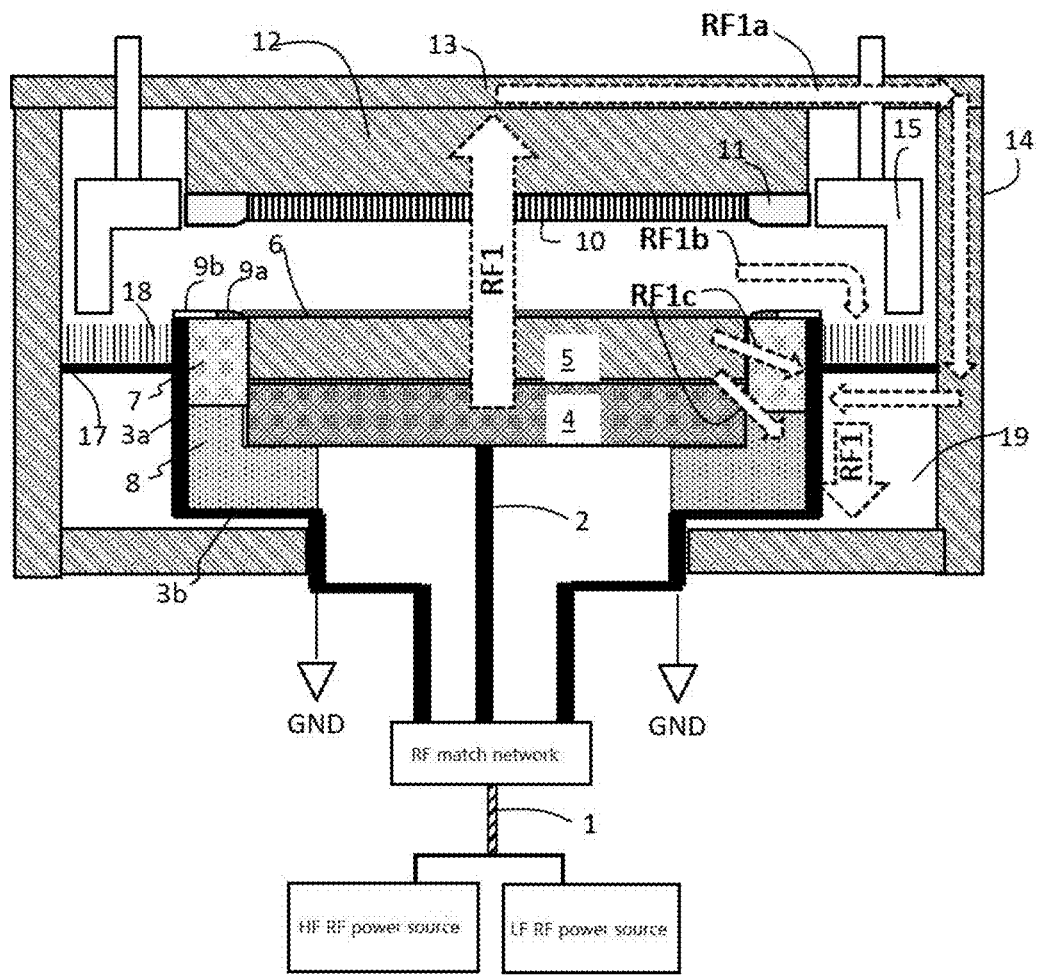
FIG. 1 is a schematic diagram of a plasma processor, where a high frequency RF power flowing path is illustrated.

FIG. 1 is a structural schematic diagram of a capacitively coupled plasma reactor, comprising: a process chamber 14, at the bottom of the process chamber 14 being provided a base 5, the base 5 further serving as a bottom electrode; an electrostatic chuck 6 being provided above the base 5 and configured to securely hold a to-be-processed wafer and control temperature of the wafer. A facilitate plate 4 is further provided beneath the base, wherein the facilitate plate and the base may be made of aluminum or other conductive material, or the facilitate plate is made of a ceramic material, wherein the facilitate plate and the base are mutually tightly fixed so as to air-tightly seal the vacuum environment above the base 5 and the atmospheric environment below the facilitate plate 4. A high frequency (HF) RF power source and a low frequency (LF) RF power source are connected to the facilitate plate 4 or the base 5 via a RF match network and a RF cable 2 so as to effectively apply the RF power of the two frequencies to the plasma reactor. A focus ring 9a and an edge ring 9b are provided at the outer periphery of the electrostatic chuck 6 so as to adjust the electric field distribution and sheath thickness of the edge area of the wafer, thereby achieving a more uniform plasma etching performance. A grounded lower ground ring 3 is further provided at the outer periphery of the disc-shaped base 5 and the facility plate 4, wherein the lower ground ring 3 includes a segment 3a enclosing the sidewall of the base 5 and a segment 3b enclosing the outer sidewall and partial bottom of the facilitate plate 4. Dielectric assembly is further provided between the base 5, the facilitate plate 4, and the lower ground ring 3 to implement isolation between the RF hot region and the lower ground ring 3, thereby reducing loss of the RF power fed into the base 5. The dielectric assembly may include a first insulating ring 7 and a second insulating ring 8 which are vertically arranged, wherein the material of the insulating rings 7 and 8 is usually ceramic such as quartz or aluminum oxide.

A gas showerhead 10 is provided on the top of the process chamber opposite the base. The gas showerhead 10 further serves as the upper electrode, the electrical field of which is mutually coupled with that of the base 5; the gas showerhead 10 also serves as a gas inlet mechanism which uniformly transmits process gases downward to the wafer surface. A conductive mounting plate 12 is provided above the gas showerhead 10 to secure the gas showerhead 10 to the chamber lid 13. An upper ground ring 11 may be optionally provided at the outer periphery of the gas showerhead 10 to adjust a RF current path of the gas showerhead 10. A moving ring 15 may be optionally provided at the outer periphery of the gas showerhead 10, wherein the vertically movable moving ring 15 may confine the plasma and gas flow distribution pattern inside the process chamber.

During the plasma etching process, the RF powers of the two frequencies are both effectively transmitted to the base 5 via a RF match network, wherein an output frequency of the high frequency RF power source may be 13.56 MHz, 27 MHz, or higher, such that enough and uniformly distributed plasma density is generated between the upper electrode and the base 5. The low frequency RF power source outputs a low RF power such as 2 MHz or 400 KHz so as to control the plasma sheath thicknesses above the wafer and the outer peripheral area of the wafer, wherein the sheath thickness and profile directly determine the energy and incident direction of incident ions. To improve uniformity of the plasma etching process performance on the wafer, it is required that the wafer have a substantially uniform plasma density and sheath thickness (incident energy and direction of ions) from the center to the edge area.

As illustrated in FIG. 1, the transmission path of the high frequency RF power RF1 during the plasma processing includes: a main path RF1a, where the high frequency RF power RF1 flows from the base 5 through the plasma (not shown) to the upper electrode, and then sequentially flows through a chamber lid 13, a sidewall 14, and a middle ground ring 17 to reach the lower ground ring 3 where the power RF1 is grounded; a first branch path RF1b, where the high frequency RF power RF1 flows through the plasma to be directly coupled to a plasma confinement ring 18 and the middle ground ring 17 which are disposed between the lower ground ring 3 and the process chamber sidewall 14, and finally reaches the lower ground ring 3; and a second branch path RF1c, where a small amount of high frequency RF power directly passes through the insulating ring 7 and the insulating ring 8 from the base 5 to reach the lower ground ring 3, finally flowing into the ground end. A large amount of testing data reveals that the plasma density in the capacitively coupled plasma processor is usually distributed in a manner of being high above the center area and low above edge area, or in a "W" shaped pattern where the densities above the center, edge area, and middle area gradually decrease.

One method of improving plasma processing uniformity is to adjust impedance on the main path RF1a or impedance on the first branch path RF1b. By adjusting the impedances on the two paths, the uniformity of plasma density may be partially improved. The researchers have tried various approaches including varying the sizes and material combinations of various parts and setting an impedance adjustment circuit on the two paths, which, however, can only improve the uniformity of plasma density above the wafer edge area, but cannot effectively solve the problem that the plasma density above the wafer center area is still relatively high.

Another approach that has been tried is to arrange dielectric material layers of different thicknesses in different areas in the base or the upper electrode so as to offset the plasma non-uniformity caused by non-uniform spatial distribution of the high frequency RF power. However, this approach can only partially offset the original non-uniformity, and in cases that the process parameters change, the combination of different dielectric material layers needs to be redesigned. In actual applications, this approach not only has a high research and development cost, but also renders a very small adjustable range to the plasma processor; therefore, this approach cannot be adapted to constantly increasing process demands.

To solve the technical problems described above, the inventors have made in-depth studies on the causes why none of the various conventional approaches can achieve a desired uniformity level of the plasma density. Researches in this field fail to find the cause for noticeable non-uniformity of plasma density based on input high frequency RF power RF1, and various attempts have been made to adjust the power distribution so as to compensate for the uniformity, which, however, can only achieve a partial improvement, and none of them can thoroughly solve the issue that the plasma density above the wafer center is noticeably high. This problem is also a major issue that has existed in the industry for a long term without an effective solution.

Through persistent studies, the inventors finally find that the root cause of this long-term pending issue is not the difference in power distribution proportions of the fundamental frequency (40 MHz, 60 MHz) among different paths in the process chamber as conventionally believed; instead, it is caused by cyclical accumulation of the harmonic RF power derived from the high frequency RF signal of the fundamental frequency in the process chamber.

Figure 2:
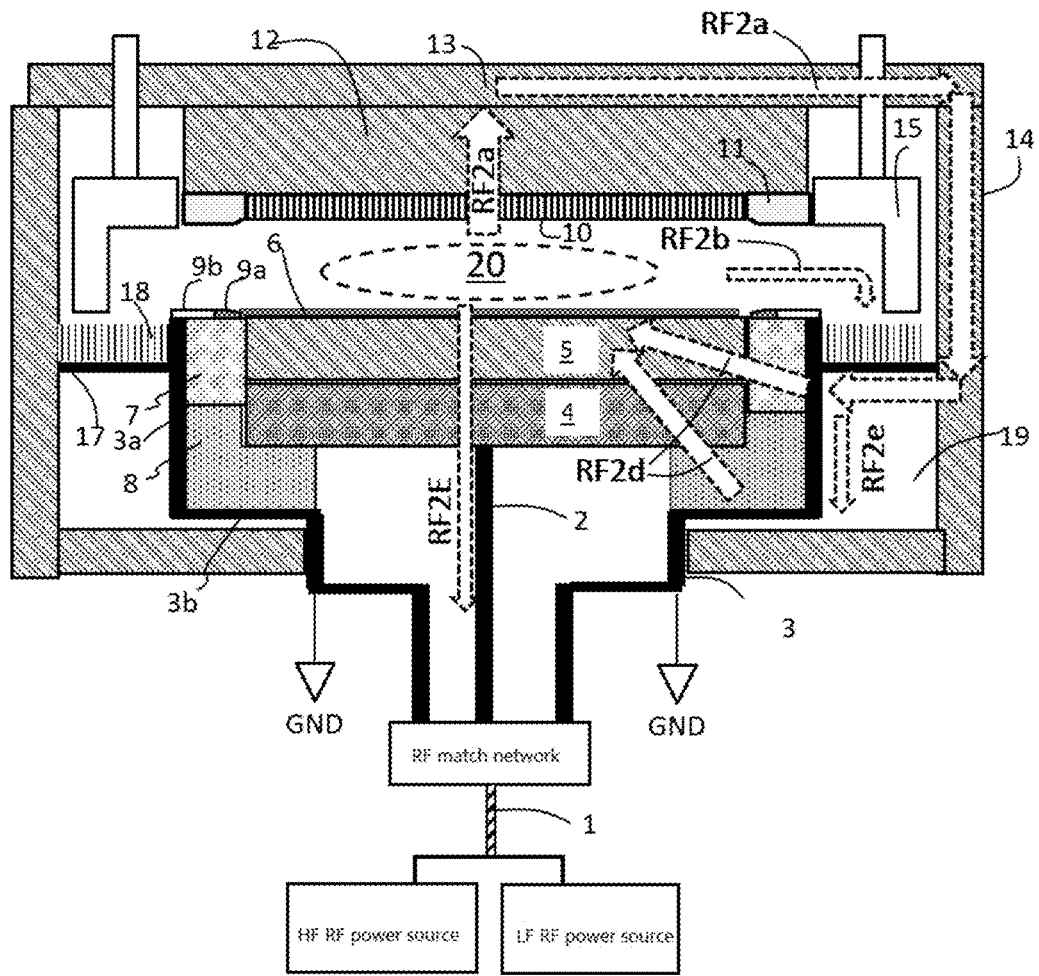
FIG. 2 is a schematic diagram of a plasma processor, where a high frequency harmonic RF power flowing path is illustrated.

FIG. 2 is a schematic diagram of a plasma processor, where a corresponding high frequency harmonic RF power flowing path is illustrated. After the high frequency RF power RF1 of a fundamental frequency (e.g., 60 MHz) has been transmitted to the base 5, plasma 20 is generated between the upper electrode and the base 5. Since the plasma has a non-linear impedance, harmonic RF power RF2 with a relatively large power (120 MHz, 180 MHz, etc.) is likely derived from the fundamental frequency (60 MHz). These harmonic RF powers are diffused from the plasma 20 towards the surrounding transmission paths, including the path RF2a with the largest power proportion, and after flowing through the upper electrode 10, the conductive mounting plate 12, the chamber lid 13, the process chamber sidewall 14, and the middle ground ring 17, till the lower ground ring 3, a large part of the harmonic RF power does not flow downward into the ground end as expected; instead, a large amount of harmonic RF power is coupled skipping the insulating rings 7, 8 to reach the base 5 and continue to circulate in the loop. For the harmonic RF power, the very high RF power causes a large equivalent capacitance Ch between the lower ground ring 3 and the base 5, such that the corresponding equivalent impedance is very small. The lower ground ring 3 extends from its junction with the middle ground ring 17 downward along the lower ground ring sidewall to connect with the ground end of the RF match network. For the RF signal of the harmonic frequency, the impedance generated by the equivalent inductance Lh on the path RF2e is greater than that generated by the equivalent capacitance Ch on the path RF2d. Therefore, a large amount of harmonic frequency RF power participates in the circulation through the path RF2d, while only a small amount of RF power flows downward into the ground end via RF2e. Besides, owing to impedance distribution, main energy of some harmonic RF power coupled to the middle ground ring 17 from the plasma 20 through the path RF2b may circulate in the paths RF2a~RF2d. Likewise, the back-propagation harmonic RF current flowing downward from the plasma 20 through RF2d~RF2a also proceeds continuously in the whole circulation. Part of the harmonic RF power flows from the plasma 20 downward through the base 5, the facility plate 4 and the RF cable into the RF match network or even into the more distant RF power source. This part of flowing path forms another RF transmission path RF2E. Since the RF match network has filters and other inductive devices, the harmonic RF power with a very high frequency will turn into other energy such as heat and dissipated in the match network, without returning to the wafer processing area above between the upper electrode and the base 5. With the inductive elements arranged therein, the RF match network has a signal impedance to the harmonic RF frequency far larger than the equivalent impedances on the harmonic RF circulating paths RF2a~RF2d; therefore, only a small amount of RF current flows downward into path RF2E and is dissipated there. The impedance proportions of the various paths show that for the very high frequency harmonic RF power RF2 generated from the plasma 20, except for a small amount of power which flows out of the process chamber through RF2e and RF2E, most of the power is cyclically superimposed in the loop jointly formed by paths RF2a~RF2d, where part of the RF power RF1 which has a fundamental frequency and is continuously inputted into the process chamber is converted into harmonic RF power. Dependent on different RF frequencies and process parameters, the value of the harmonic RF power RF2 is about 10~50% of the inputted RF power RF1 of the fundamental frequency; in the continuous circulation process, since a large part of the harmonic RF power has been continuously accumulated to a considerable level, a balanced state is finally achieved. In contrast, the continuously inputted RF power RF1 of the fundamental frequency flows downward into the ground end along the lower ground ring 3 in FIG. 1, without forming a long-term accumulation. The process in which the high frequency power RF1 of the fundamental frequency continuously flows out in the process chamber while the harmonic RF power constantly accumulates finally results in that the harmonic RF power RF2 which is originally far less than the inputted RF power RF1 of fundamental frequency generates an impact far beyond the expectation on the plasma density in the process chamber.

Figure 3:
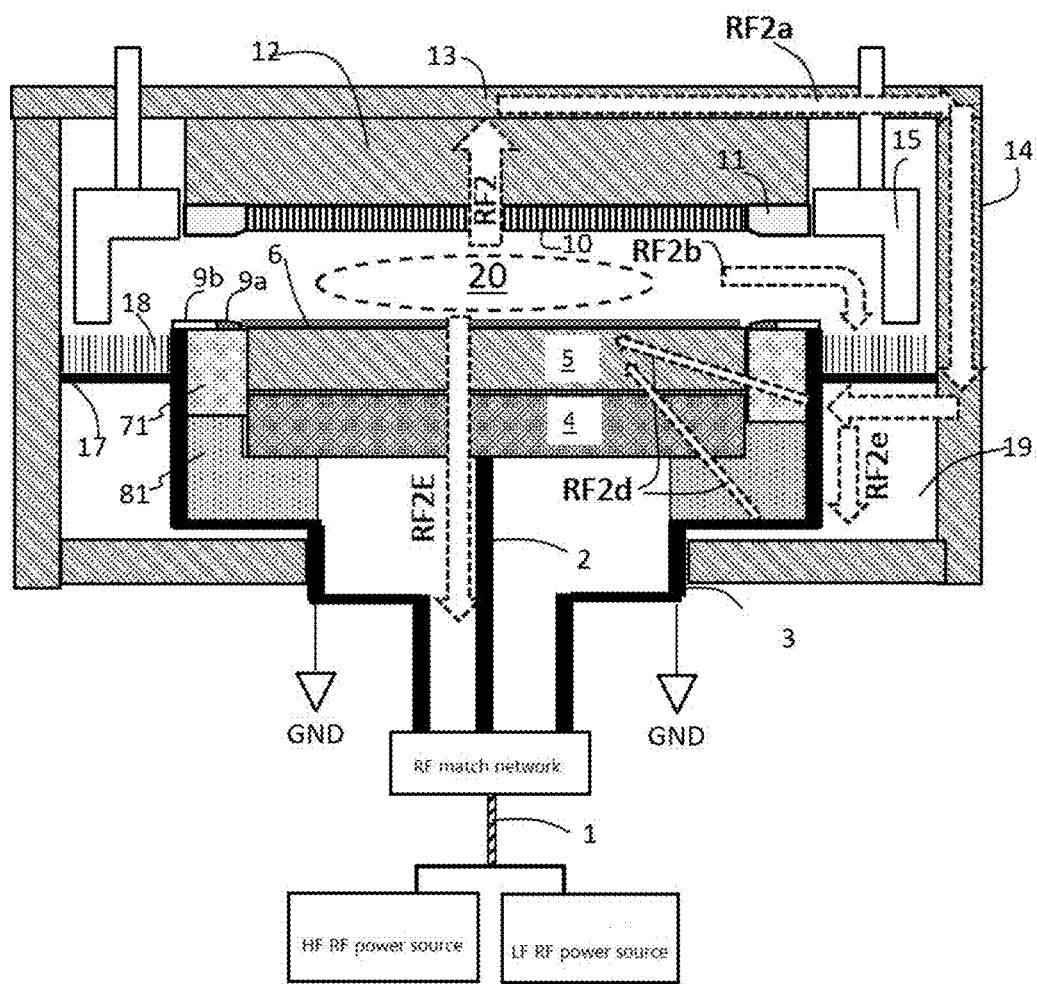
FIG. 3 is a schematic diagram of a plasma processor according to the present disclosure, where a high frequency harmonic RF power flowing path is illustrated.

Based on the above findings, the inventors provide a plasma processor, comprising: a process chamber 14, provided with a base 5 at the inner bottom, the base 5 being connected to a RF power source via a RF match network circuit, an electrostatic chuck 6 being provided on the base, the upper surface of the electrostatic chuck 6 being configured to attract a to-be-processed wafer, an upper electrode and a chamber lid 13 which are opposite the base 5 being provided above the to-be-processed wafer; a facilitate plate 4, which is disposed beneath the base 5; a lower ground ring 3 surrounding the base and the side surfaces and part of the bottom surface of the facility plate, one or more insulating rings 71, 78 being disposed between the base, the facility plate, and the lower ground ring 3; a middle ground ring 17 electrically connected between the lower ground ring 3 and the inner wall of the process chamber 14; and a high frequency RF power source and a low frequency RF power source, which transmit a RF power to the base via the RF match network. The insulating rings 71, 81 are made of organic polymer, particularly various kinds of resin materials with a dielectric constant less than 3.5, e.g., PTFE, polyimide, etc. FIG. 3 describes the power proportions of the harmonic RF power RF2 in various paths according to the present disclosure, wherein the insulating rings are made of a special material. Since the insulating rings 71, 81 are made of a material with a low dielectric constant, their equivalent capacitances Ch also decrease, as a result, their impedances to a harmonic RF signal also increase significantly. Measurements show that the impedances of the insulating rings 7, 8 to the harmonic RF signal in FIG. 1 are only 3 ohms; however, after changing the material of the insulating rings 71, 81 to a low dielectric material, their impedances increase to dozens of ohms, and in combination with the impedances of other parts in the harmonic RF circulating paths (RF2a~RF2d), the final total impedance of the harmonic RF circulating paths is close to or even larger than the impedance of the RF match network ground circuit. It can be seen in FIG. 3 that under such an impedance proportion, the RF power flowing through the paths RF2E and RF2e of the RF match network is greater than the harmonic RF power flowing through the couple path RF2d of the insulating rings 71, 81. In this way, the RF power participating in the harmonic RF circulation (passing through path RF2d) decreases significantly, where a large part of the harmonic RF power is dissipated on path RF2E or flows out via path RF2e. Since a large amount of harmonic RF power does not participate in cyclical accumulation and the harmonic RF power RF2 only occupies a small part of the inputted RF power of fundamental frequency, the harmonic RF power does not have a significant impact on the plasma density distribution above the wafer.

Figure 4A:
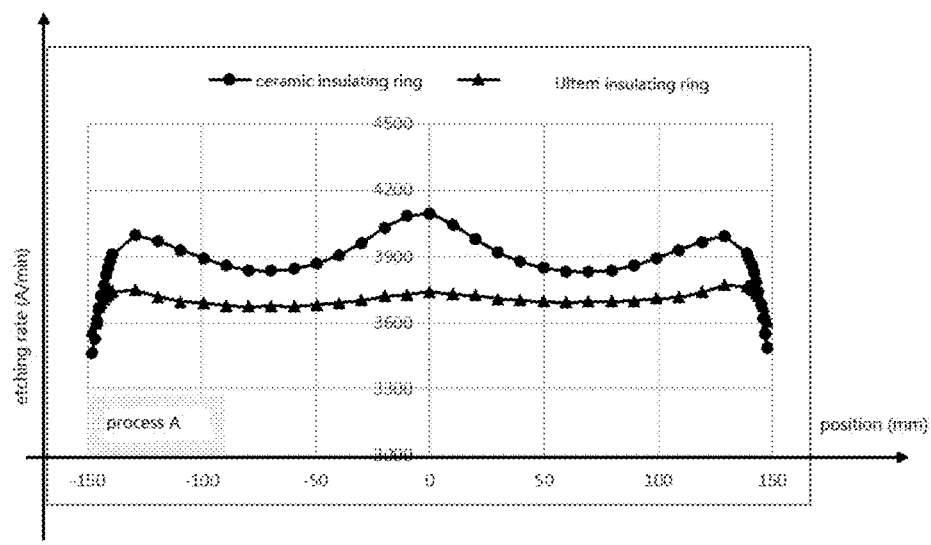
FIG. 4a is an etching rate distribution diagram achieved when performing plasma processing A according to the present disclosure, compared with that achieved by a conventional technology.

FIG. 4a illustrates an etching rate distribution diagram achieved when performing plasma processing A according to the present disclosure compared with that achieved by a conventional technology. The figure shows that when the insulating ring adopts a ceramic material, its etching rate forms a W-shaped distribution from the wafer center area to the wafer edge area, wherein the highest etching rate in the center area reaches 4200 A/min, while the lowest etching rate in the edge area is about 3800 A/min, with a difference therebetween reaching about 10%. Even other compensation means are adopted, such a large difference can hardly be narrowed to reach an etching rate uniformity with only 1-2% discrepancy. In the technical solution of the present disclosure, the insulating ring adopts an Ultem material; in this case, the highest etching rate in the center area is 3739 A/min and the lowest etching rate on the wafer also reaches 3692 A/min, with the difference therebetween being only 1%, significantly increasing the etching uniformity. With the technical solution of the present disclosure, since the plasma density uniformity is significantly improved, various technical adjustment means are allowed in the limited space inside the process chamber to improve other indicators (e.g., temperature uniformity, gas flow distribution, etc.), thereby saving considerable research and development costs and internal space.

Figure 4B:
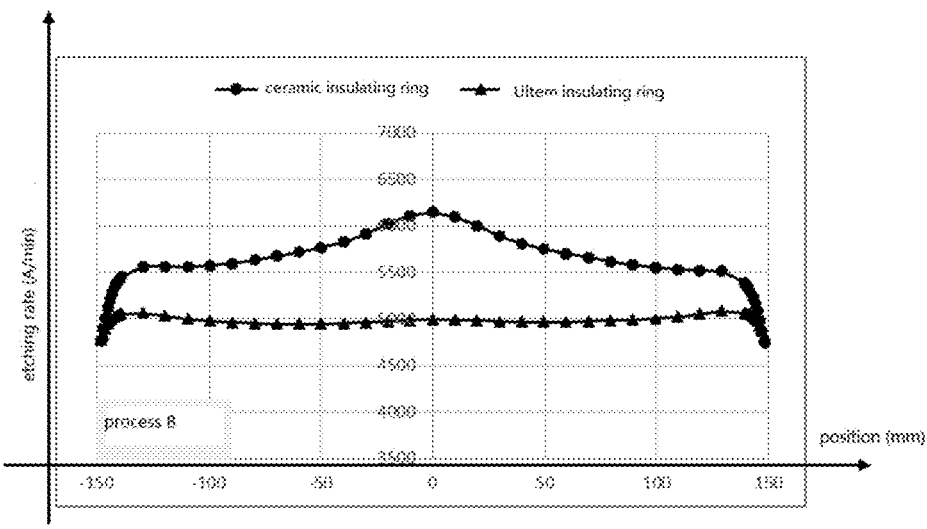
FIG. 4b is an etching rate distribution diagram achieved when performing plasma processing B according to the present disclosure, compared with that achieved by a conventional technology.

The technical solution of the present disclosure can achieve a prominent effect in various plasma processing. FIG. 4b shows an etching rate distribution diagram achieved when performing plasma processing B according to the present disclosure compared with that achieved by a conventional technology. In this figure, it can be seen that when the conventional plasma processor performs processing B, its etching rate distribution assumes a profile of gradually decreasing from the center area to the edge area. The etching rate at the highest point in the center area may reach 6146 A/min, while the etching rate at the lowest point in the edge area is only 5564 A/min, with the difference therebetween being also about 10%. When the plasma processor of the present disclosure is adopted, the etching rate distribution curve is noticeably improved, where the ratio between the highest etching rate and the lowest etching rate is 4990: 4945, with a difference therebetween being within 1%.

In the present disclosure, the shape of insulating rings 71, 81 may have a plurality of choices. For example, the insulating ring 71 may further include portions extending inwardly or portions extending upward or downward, or the insulating rings 71, 81 may be a combination of more separate ring-shaped parts, or may be an integral part, as long as the insulating ring assembly can implement electrical isolation between the base 5 and the lower ground ring 3, such that the equivalent capacitance therebetween is significantly lower than that of conventional technologies. Besides solid resin, the insulating rings 71, 81 may also be formed by a combination of a solid ring and a ring-shaped dielectric coefficient adjustment cavity, wherein the dielectric coefficient adjustment cavity is injected with a dielectric fluid, such that the global dielectric constant of the insulating ring is adjustable by changing the fluid level and fluid type of the dielectric fluid. With the dielectric constant being adjustable, the proportion between the equivalent capacitance Ch and the harmonic RF power flowing through path RF2d is also adjustable.

In the present disclosure, the middle ground ring 17 is electrically connected between the sidewall 3a of the lower ground ring 3 and the inner wall of the process chamber 14 to realize reverse flow of the RF power of fundamental frequency and the harmonic RF power. The middle ground ring 17 may be a plurality of radial spokes, wherein one ends of the spokes are connected to the sidewall 3a of the lower ground ring 3, and the other ends thereof are connected to the inner wall of the process chamber. The middle ground ring may optionally be a conductive plate, wherein a large number of gas through-holes are provided on the plate such that gases flowing downward through the plasma confinement ring 18 above can pass through the through-holes to reach a gas exhaust chamber 19 below. The gas exhaust chamber 19 is further connected to a gas exhaust system including a pump and a valve so as to exhaust reaction byproduct gases and control the pressure in the process chamber. The inner and outer sides of the middle ground ring 17 may be mechanically, mutually tightly pressed against the conductive surface of the ground ring sidewall 3a or against the conductive fixation mechanism in the inner wall of the process chamber, respectively, thereby realizing a good electrical conductivity. One side of the middle ground ring 17, e.g., the outer side proximal to the inner wall of the process chamber, may not tightly contact the inner wall of the process chamber, but is electrically connected with the inner wall of the process chamber via an additional conductive part, wherein the conductive part may be a conductive connector with enough elasticity, or the conductive part may be serially connected with a specially designed impedance device or a variable impedance device, e.g., a variable capacitor, etc. The impedance device may not only vary distribution of the harmonic RF power, but also may adjust path distribution of the high frequency RF power of the fundamental frequency. With joint action between the insulating rings 71, 81 and the impedance device, the plasma distribution uniformity can be better adjusted.

Figure 5:
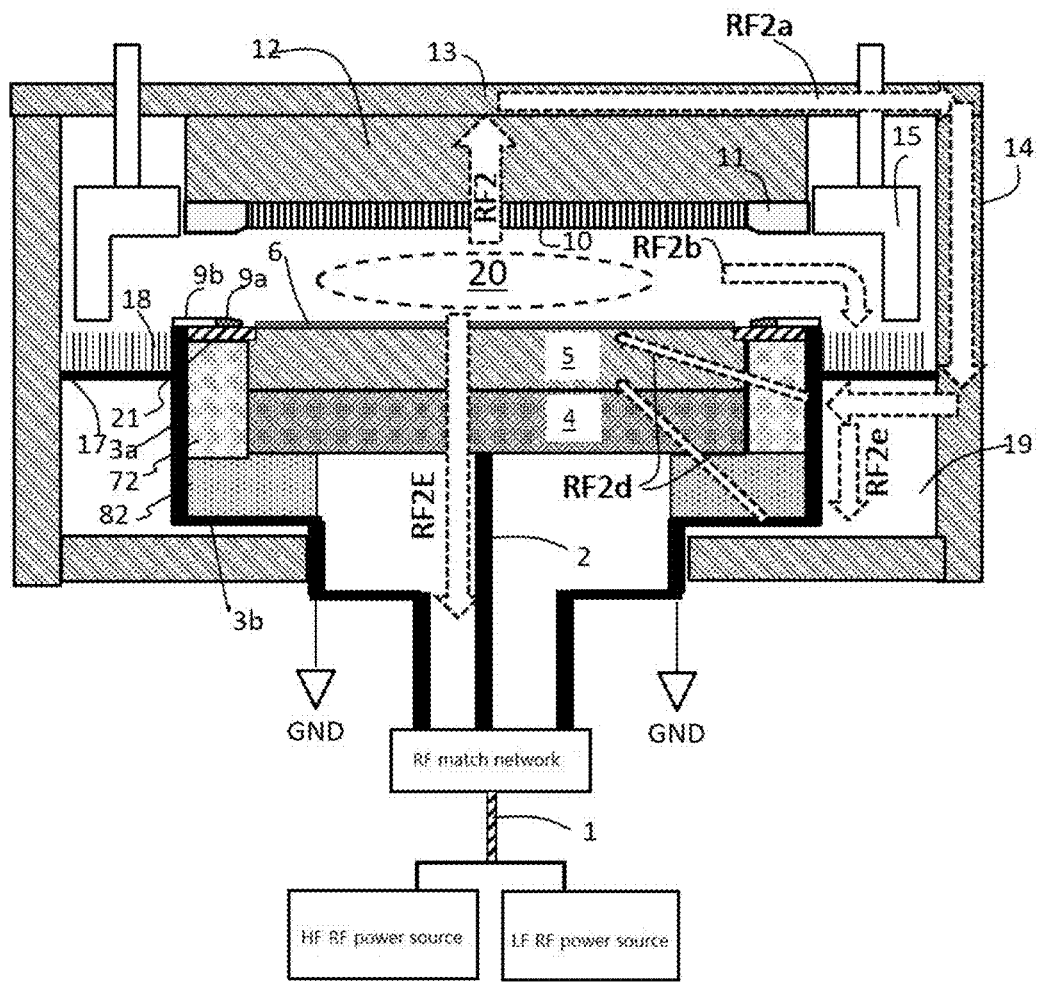
FIG. 5 is a schematic diagram of another embodiment of a plasma processor according to the present disclosure.

The present disclosure further provides another embodiment. As shown in FIG. 5, the insulating ring 72 has a thickness that may enclose the outer peripheries of the base and the facility plate, and the insulating ring 82 is disposed beneath the facility plate, only isolating the facility plate from the lower ground ring 3b. In the present disclosure, since the insulating rings 72, 82 adopt organic polymer, which has a lower thermal conductivity and a higher thermal expansion coefficient than a ceramic material, expansion of the insulating rings caused by temperature rise will be more drastic under the same processing environment. A coolant channel is usually further provided in the base 5, wherein the temperature of the base is controlled substantially stable by coolant circulation; however, a large amount of heat generated by the plasma will be transmitted downward through the focus ring 9a and the edge ring 9b above the insulating ring 72, causing volume expansion of the insulating ring. The significant expansion causes the focus ring 9a and the edge ring 9b surrounding the insulating ring 72 to be lifted and the outside lower ground ring 3a to be partially expanded outwardly, thereby causing drift of many parameters of the plasma processor. On the other hand, upon termination of plasma processing, the temperature resumes the initial value; however, the deformed and displaced parts cannot surely resume their initial states. Such deformations are likely to cause permanent damages to the parts. To solve this problem, the present disclosure provides a ceramic ($Al_2O_3$) couple ring 21 above the insulating ring 72, wherein the couple ring 21 covers the upper surface of the insulating ring 72, the inner bottom surface of the couple ring 21 being in close contact with the base 5 so as to increase heat conduction; as such, the heat of the plasma above is effectively conducted to the base 5 where the temperature is stable. The heat flowing into the insulating ring 72 from the plasma above is also significantly decreased, avoiding the impact on the plasma processing caused by the too high thermal expansion coefficient of the resin insulating ring. The couple ring 21 may optionally be an integral ring covering the upper surface of the outer side of the base 5 and the upper surface of the insulating ring 72, or a combination of multiple rings. Any ring-shaped structure that can block the heat from flowing downward into the insulating ring 72 satisfies the definition of the couple ring in the present disclosure. The couple ring 21 can prevent significant temperature rise as long as it covers most of the surface of the insulating ring; even without a full coverage, the objectives of the present disclosure can still be achieved.

Figure 6:
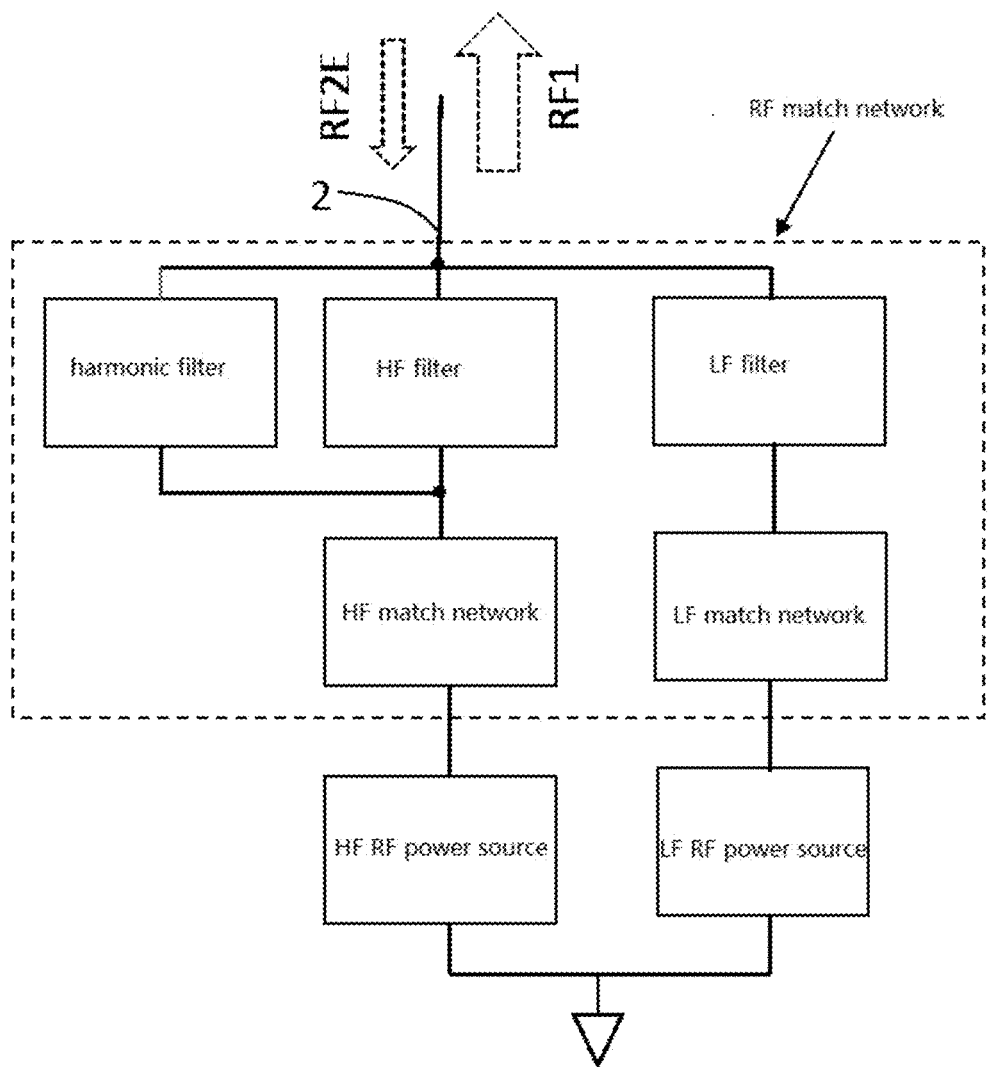
FIG. 6 is a structural schematic diagram of a RF match network in another embodiment of the plasma processor according to the present disclosure.

As illustrated in FIG. 6, the RF match network in the present disclosure may include two match circuits to realize matching with the high frequency RF power and the low frequency RF power, respectively. The RF match network may further include at least two filter circuits, which only allow the powers of high frequency RF frequency and the low frequency RF frequency to pass through, respectively, thereby preventing signals of other frequencies to reversely flow into the RF power sources below. Further, as revealed in the present disclosure, the cause of non-uniform plasma distribution on the wafer is that the harmonic RF power cannot be quickly dissipated, but cyclically accumulated in the process chamber. In the present disclosure, a harmonic filter may be provided in the RF match network, wherein the harmonic filter has a low impedance to the harmonic RF power RF2 (120 MHz, 180 MHz) and meanwhile blocks the power (60 MHz) inputted into the process chamber from the high frequency RF power source from flowing out of the harmonic filter. As illustrated in FIG. 6, the harmonic filter is connected to both ends of the high frequency filter, or parallel connected to both ends of the low frequency filter. The harmonic filter as provided may further reduce the impedance of the RF match network to the harmonic RF signal; further in conjunction with a relatively low equivalent capacitance Ch, more harmonic RF power flows downward into the RF match network via the RF cable connected to the base and is dissipated therein, without entering the harmonic RF circulating path. The harmonic filter may include a variable capacitor or a variable inductor, such that the harmonic filter may adjust the impedance ratio between the fundamental frequency and the harmonic frequency; as such, the proportion of the harmonic RF power flowing into the RF match network can be adjusted, and thus the plasma density distribution on the wafer can be adjusted. For some plasma processing, it is required that the plasma density above the center area be slightly higher so as to compensate for imbalance of other parameters; with the impedance adjustable harmonic filter, the density distribution may be finely adjusted while ensuring a substantially uniform plasma density above the wafer, thereby achieving a better plasma processing performance.

According to the present disclosure, by changing the material selected for the insulating ring, more of the harmonic RF power generated in the capacitively coupled plasma processor flows into the RF match network along the cable and is dissipated there. Further, by disposing the harmonic filter at any position of the RF match network or RF cable, the harmonic RF power may effectively flow out. As long as the inputted fundamental frequency is high enough (40 MHz, 60 MHz, 100 MHz, etc.), a large amount of harmonic RF power will be generated in the process chamber; dependent on different frequencies and specific process parameters, 10~50% of the input RF power is converted into harmonic RF power. By selecting different materials for the insulating rings or designing the circuits as described above, the present disclosure enables a large part (50%) of the harmonic RF power generated by the fundamental frequency inputted into the process chamber, i.e., over 5~25% of the inputted high frequency RF power, or preferably over 10% of the above, to flow into the RF match network via the RF cable, without entering the harmonic RF circulating path, thereby significantly improving plasma processing uniformity.

The plasma processing as provided in the present disclosure is not limited to plasma etching, which may also be applied to plasma-enhanced chemical vapor deposition (PECVD). Any plasma processing apparatus which requires input of a high frequency (over 40 MHz) RF power and performs processing using the plasma generated by the high frequency RF power may adopt the technical solutions of the present disclosure. Since the plasma processing field such as PECVD does not need downward etching, the low frequency RF power becomes unnecessary, such that it is only required to input the high frequency RF power to the base that is configured to mount the wafer. The present disclosure reveals the root cause of non-uniform plasma density distribution generated when applying the high frequency RF power to the capacitively coupled plasma process chamber, proposes a variety of solutions including selecting a low dielectric constant insulating ring or changing the impedance of the RF match network to the harmonic RF signal, so as to lead more harmonic RF power into the RF match network, thereby reducing the proportion of the harmonic RF power flowing into the circulating path. In this way, the impact of the harmonic RF power on the plasma distribution uniformity is minimized.

Although the contents of the present disclosure have been described in detail through the foregoing preferred embodiments, it should be understood that the depictions above shall not be regarded as limitations to the present disclosure. After those skilled in the art having read the contents above, many modifications and substitutions to the present disclosure are all obvious. Therefore, the protection scope of the present disclosure should be limited by the appended claims.

What is claimed is:

1. A plasma reactor, comprising:
   a process chamber having a top, a bottom and a sidewall, a base is provided at the bottom, the base being connected to a radio-frequency RF power source via a RF match network, wherein a to-be-processed wafer is held above the base, an upper electrode assembly is provided at the top of the process chamber, and a plasma processing space is located between the base and the upper electrode assembly;
   a first conductive ground ring surrounding the outer periphery of the base;
   a second conductive ground ring connected between an outer sidewall of the first conductive ground ring and the sidewall of the process chamber, a plurality of gas channels being provided on the second conductive ground ring such that gas in the plasma processing space is exhausted through the plurality of gas channels;
   an insulating ring provided between the base and the first conductive ground ring, wherein dielectric constant of the insulating ring is less than 3.5.

2. The plasma reactor according to claim 1, wherein the RF power source outputs a high frequency RF power that is greater than 40 MHz.

3. The plasma reactor according to claim 1, wherein a facility plate is further provided beneath the base, the first conductive ground ring surrounding the facility plate.

4. The plasma reactor according to claim 1, wherein a second insulating ring surrounding the facility plate is disposed between the facility plate and the first conductive ground ring.

5. The plasma reactor according to claim 4, wherein the second insulating ring covers part of the bottom surface of the facility plate, and dielectric constant of the second insulating ring is lower than 3.2.

6. The plasma reactor according to claim 3, wherein the insulating ring surrounds the base and the facility plate, and a second insulating ring is disposed beneath the facility plate.

7. The plasma reactor according to claim 1, wherein a coupling ring is provided above the insulating ring, the coupling ring covering an upper surface of the insulating ring thereby decreasing heat flow from the plasma into the insulating ring, and the coupling ring further covering an upper surface of base edge portion so as to increase heat conduction to the base, wherein the coupling ring is made of a first ceramic material which has a thermal conductivity higher than that of the insulating ring.

8. The plasma reactor according to claim 7, wherein a focus ring and an edge ring are disposed above the coupling ring, the focus ring and the edge ring covering the coupling ring, the upper surfaces of the focus ring and the edge ring being exposed to the plasma processing space.

9. The plasma reactor according to claim 1, wherein a plasma confinement ring is provided above the second conductive ground ring, the plasma confinement ring surrounding the base.

10. The plasma reactor according to claim 1, wherein one or more adjustable impedance devices are connected between the second conductive ground ring and the sidewall of the process chamber.

11. A plasma reactor, comprising:
    a process chamber having a top, a bottom, and a sidewall, the process chamber being provided with a base at the bottom, the base being connected to a RF power source via a RF match network, wherein a to-be-processed wafer is held above the base, an upper electrode assembly is provided at the top of the process chamber, and a plasma processing space is provided between the base and the upper electrode assembly;
    a first conductive ground ring surrounds the base;
    a second conductive ground ring connected between the first conductive ground ring and the sidewall of the process chamber, a plurality of gas channels being provided on the second conductive ground ring such that gas in the plasma processing space is exhausted through the plurality of gas channels;
    and an insulating ring provided between the base and the first conductive ground ring, dielectric constant of the insulating ring being lower than 3.5;
    wherein the RF match network supplies a high frequency RF power of a fundamental frequency to the base via at least one RF cable, the fundamental frequency being greater than or equal to 40 MHz; the plasma in the plasma processing space generates a harmonic RF power derived from the fundamental frequency, the harmonic RF power flowing through the at least one RF cable into the RF match network, wherein the harmonic RF power flowing into the RF match network is greater than 5% of the high frequency RF power.

12. The plasma reactor according to claim 11, wherein the RF match network includes a first filter configured for the high frequency RF power to pass through, and further includes a second filter configured for the harmonic RF power to pass through but blocking the high frequency RF power.

13. The plasma reactor according to claim 11, wherein the RF power source includes a high frequency RF power source which outputs a RF power having the fundamental frequency, and further includes a low frequency RF power source which outputs a RF power having a bias frequency that is lower than or equal to 2 MHz.

14. The plasma reactor according to claim 12, wherein the RF match network includes a match circuit configured for the high frequency RF power to be transmitted into the process chamber, the first filter and the match circuit being serially connected between the RF cable and the RF power source; and the RF match network further includes an impedance adjustment circuit configured to have an adjustable impedance to the high frequency RF power and the harmonic RF power.

* * * * *